(12) United States Patent  
Kuiper et al.

(10) Patent No.: US 9,379,291 B2  
(45) Date of Patent: Jun. 28, 2016

(54) PHOSPHOR IN WATER GLASS FOR LEDS

(71) Applicant: KONINKLIJKE PHILIPS N.V., Eindhoven (NL)

(72) Inventors: Stein Kuiper, Neerijnen (NL); Grigoriy Basin, Santa Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/362,411

(22) PCT Filed: Dec. 5, 2012

(86) PCT No.: PCT/IB2012/056997  
§ 371 (c)(1),  
(2) Date: Jun. 3, 2014

(87) PCT Pub. No.: WO2013/088309  
PCT Pub. Date: Jun. 20, 2013

(65) Prior Publication Data  
US 2015/0221833 A1  Aug. 6, 2015

Related U.S. Application Data

(60) Provisional application No. 61/576,413, filed on Dec. 16, 2011.

(51) Int. Cl.  
*H05B 33/02* (2006.01)  
*H01L 33/00* (2010.01)  
*H01L 33/50* (2010.01)  
*C09K 11/59* (2006.01)  
*C03C 4/12* (2006.01)  
*C03C 14/00* (2006.01)

(52) U.S. Cl.  
CPC . *H01L 33/50* (2013.01); *C03C 4/12* (2013.01); *C03C 14/004* (2013.01); *C09K 11/592* (2013.01); *H01L 33/502* (2013.01); *C03C 2214/04* (2013.01); *H01L 2933/0091* (2013.01)

(58) Field of Classification Search  
CPC .................. H01L 33/50; H01L 33/502; H01L 2933/0091; C03C 4/12; C03C 14/004; C03C 2214/04; C09K 11/592  
See application file for complete search history.

(56) References Cited

U.S. PATENT DOCUMENTS

2007/0182323 A1* 8/2007 Ogata et al. .................... 313/512  
2008/0067534 A1* 3/2008 Hsieh et al. ...................... 257/98

(Continued)

FOREIGN PATENT DOCUMENTS

CN   101468878 A    7/2009  
DE   102009037732 A1  2/2011

(Continued)

OTHER PUBLICATIONS

First Office Action issued May 6, 2015 from Chinese Application No. 201280062090.6.

(Continued)

*Primary Examiner* — Donald Raleigh

(57) ABSTRACT

The invention provides a lighting unit comprising a light source and a light conversion layer, wherein the light source is configured to provide light source light and comprises a light emitting diode (LED), wherein the light conversion layer comprises an alkali silicate matrix containing a particulate luminescent material, and wherein the light conversion layer is configured to convert at least part of the light source light into luminescent material light.

19 Claims, 2 Drawing Sheets

(56) References Cited

U.S. PATENT DOCUMENTS

| | | |
|---|---|---|
| 2009/0085009 A1 | 4/2009 | Toda et al. |
| 2009/0101930 A1* | 4/2009 | Li .................................. 257/98 |
| 2009/0123764 A1* | 5/2009 | Morita .................. C08G 77/20 428/446 |
| 2009/0289271 A1* | 11/2009 | Tian et al. ........................ 257/98 |
| 2010/0061078 A1* | 3/2010 | Kim ................................. 362/84 |
| 2011/0147778 A1* | 6/2011 | Ichikawa ......................... 257/98 |
| 2011/0180769 A1* | 7/2011 | Lamminmaki et al. ....... 252/588 |
| 2011/0192321 A1* | 8/2011 | Bohlander et al. .......... 106/286.7 |
| 2012/0057337 A1 | 3/2012 | Liebald |
| 2012/0270056 A1 | 10/2012 | Zhou |
| 2013/0004699 A1 | 1/2013 | Zhou |

FOREIGN PATENT DOCUMENTS

| | | |
|---|---|---|
| EP | 2481571 A2 | 8/2012 |
| JP | 2010003783 A | 1/2010 |
| JP | 20100003779 A | 1/2010 |
| JP | 2010059260 A | 3/2010 |
| WO | 2007073496 A2 | 6/2007 |
| WO | 2009132840 A2 | 11/2009 |
| WO | 2010027672 A2 | 3/2010 |
| WO | 2011035474 A1 | 3/2011 |
| WO | 2011035475 A1 | 3/2011 |
| WO | 2011035479 A1 | 3/2011 |
| WO | 2011111462 A1 | 9/2011 |

OTHER PUBLICATIONS

Second Office Action issued Jan. 15, 2016 from Chinese Application No. 201280062090.6.

EPO as ISA, International Search Report mailed May 3, 3013 from International Application No. PCT/IB2012/056997 filed Dec. 5, 2012.

* cited by examiner

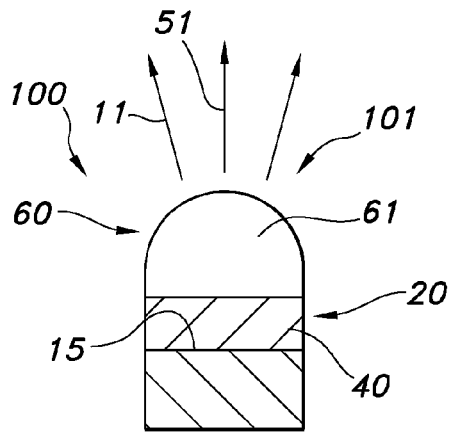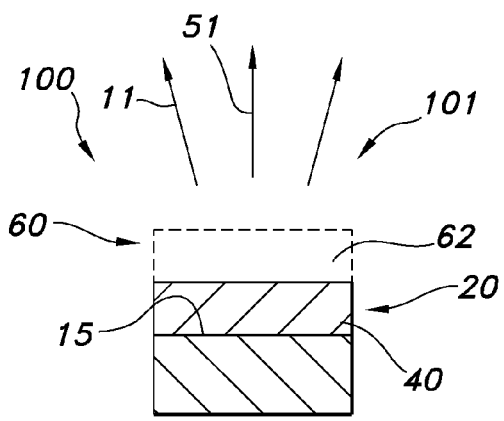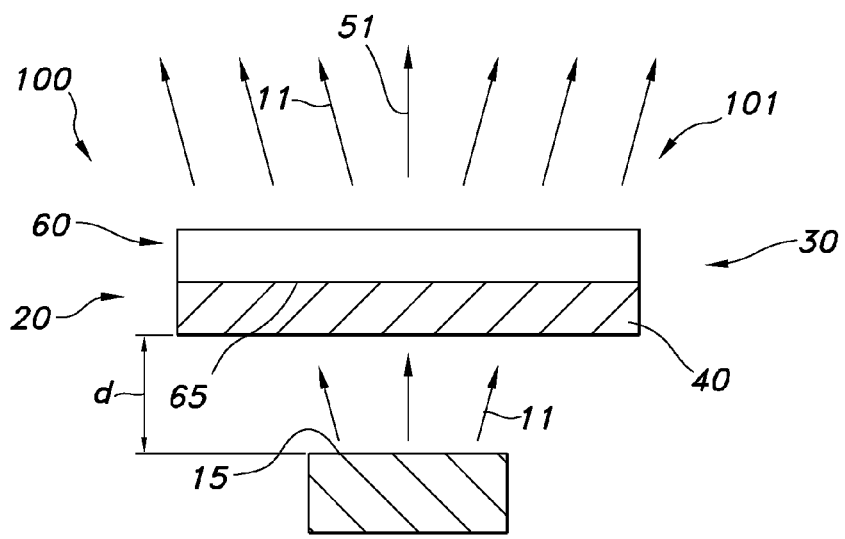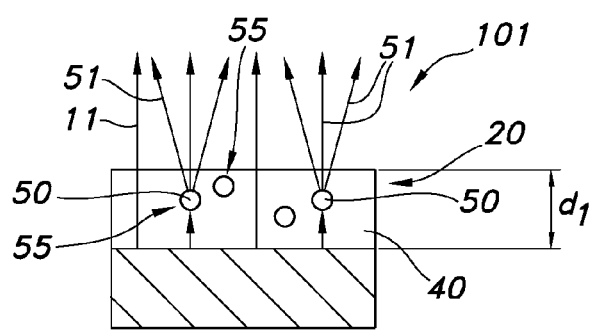

PHOSPHOR IN WATER GLASS FOR LEDS

CROSS-REFERENCE TO PRIOR APPLICATIONS

This application is the U.S. National Phase application under 35 U.S.C. §371 of International Application No. PCT/IB2012/056997, filed on Dec. 5, 2012, which claims the benefit of U.S. Patent Application No. 61/576,413, filed on Dec. 16, 2011. These applications are hereby incorporated by reference herein.

FIELD OF THE INVENTION

The invention relates to a lighting unit comprising a LED (light emitting diode) based light source and a light conversion layer.

BACKGROUND OF THE INVENTION

LED based light sources with conversion layers are known in the art. WO/2007/073496, for instance, describes a lighting device comprising at least one solid state light emitter and at least one luminescent element spaced from the light emitter, a surface of the luminescent element being at least twice as large as the illumination surface of the light emitter. Also, a lighting device comprising at least one solid state light emitter and at least one luminescent element spaced from the light emitter, a surface area of a projection of the luminescent element being at least twice as large as a surface area of a projection of the light emitter, is described in this document.

WO/2010/027672 describes a light source and a method for fabricating the same. The light source includes a die, a light conversion component, and a scattering ring. The die emits light of a first wavelength through a top surface of the die and one or more side surfaces of the die, and is bonded to a mounting substrate. The light conversion component converts light of the first wavelength to light of a second wavelength, the light conversion component having a bottom surface bonded to the top surface of the die. The light conversion component has lateral dimensions such that a space exists around the die, the space being bounded by the substrate and the light conversion component. The scattering ring is positioned in the space such that a portion of the light emitted from the side surfaces of the die is scattered into the light conversion component.

SUMMARY OF THE INVENTION

Phosphor-converted LEDs are used in many applications including illumination, LCD back lighting and automotive. In order to convert the blue light into white light, different luminescent material systems are used. Usually, the luminescent material particles are bound to the LED surface with organic or hybrid organic/inorganic systems. A typical example of an organic system is epoxy. A typical example of an organic/inorganic system is silicone.

Epoxies may not be used in high power LED packages since they degrade (oxidize) in the presence of high-intensity blue light. Silicones are much more stable to blue light but they can also degrade for the combination of intense blue light and high temperature. In luminescent material-converted LEDs heat is generated on the surface of the luminescent material particles due to the Stokes shift. The heat affects the polymer matrix that surrounds the luminescent material particles, causing oxidation of the polymer in the contact area with luminescent material. The polymer is a heat insulating material and therefore restricts heat diffusion towards the heat sink underneath the GaN. This keeps the heat within the area of the luminescent material grains. Thus the temperature on the surface of the luminescent material grains becomes extremely high and as a result causes the polymer to burn. The polymer degradation on the surface of the luminescent material grains may cause an undesired color shift and loss in light output. Furthermore, the higher the luminescent material temperature, the lower the conversion efficiency.

Hence, it is an aspect of the invention to provide an alternative matrix, which preferably further at least partly obviate one or more of above-described drawbacks. Especially, the alternative matrix is thermally more conductive and/or thermally more stable than silicone matrices. Further, the alternative matrix is transparent for visible light. Further, preferably, the alternative matrix has an index of refraction that is substantially identical to the index of refraction of silicones (that might be applied on top of the matrix). Further, preferably the matrix, or more precisely the light conversion layer comprising the matrix with luminescent material, is relatively easily applicable to a substrate.

Surprisingly, it appears that water glass may fulfill one or more of the above indicated properties, and may thus be used as matrix. Hence, the invention provides the use of water glass as matrix for a luminescent material. Such matrix may be applied as (in) a layer on top of the LED die or on a substrate on the LED die or remote from the LED die.

Water glass is resistant against extremely high temperatures and conducts heat about 10 times better then silicone. Further, it is transparent for visible light. It also appears that the index of refraction is comparable to the index of refraction of at least a number of silicones. Due to its inorganic nature, water glass does not (substantially) suffer from thermal degradation in an LED environment. Furthermore, its relatively high thermal conductivity keeps the luminescent material temperature low. The water glass coating can also provide mechanical strength and therefore replace laminated glass wafers.

Hence, in a first aspect, the invention provides a lighting unit comprising a light source and a light conversion layer, wherein the light source is configured to provide light source light and comprises a light emitting diode (LED), wherein the light conversion layer comprises an alkali silicate matrix ("matrix"), especially (solid) water glass, containing a particulate luminescent material, and wherein the light conversion layer is configured to convert at least part of the light source light into luminescent material light. The term "matrix" may refer to the fact that the luminescent material particles are enclosed by the matrix, i.e. the particles are embedded in the matrix, even though the amount of alkali silicate matrix may be low. The term "matrix" may also refer to the fact that the matrix may be a substantially continuous phase.

As indicated above, such lighting unit may benefit from the fact that the light conversion layer may be stable, thermal energy may better be conducted away, and thus the light conversion may be more efficient. Further, application of the layer may be relatively simple.

The term light source may in principle relate to any light source known in the art. Preferably, the light source is a light source that during operation emits at least light at a wavelength selected from the range of 200-490 nm, especially a light source that during operation emits at least light at wavelength selected from the range of 400-490 nm. This light may partially be converted by the luminescent material (see below). In a specific embodiment, the light source comprises a solid state LED light source (such as a LED or laser diode). The term "light source" may also relate to a plurality of light sources, such as 2-20 (solid state) LED light sources. Hence, in a specific embodiment, the light source comprises a light emitting diode. Even more especially, the light source is configured to generate blue light (in operation). Hence, at least part of the blue light may be converted by the light conversion layer, for instance in yellow, or yellow and red, or green and red, etc.

The light conversion layer is configured to convert at least part of the light source light into luminescent material light. The light conversion layer can be configured in a transmissive configuration, with light source light impinging on one side of the light conversion layer and luminescent material light and optionally light source light escaping from an opposite side of the light conversion layers (which does not exclude luminescent material light also escaping from the one side of the light conversion layer and/or light source light being reflected/scattered at (from) the one side of the light conversion layer). The light conversion layer can also be configured in a reflective configuration, with light source light impinging on one side of the light conversion layer and luminescent material light only able to escape from the same side layers (which does not also light source light being reflected/scattered at (from) the one side of the light conversion layer). The former configuration can for instance be used when the light conversion layer is applied on the LED die or on an exit window. The latter configuration can for instance be applied on walls or other parts of a light cavity, for instance instead of or on top of a reflective layer. Note that both configurations may be applied (in the (same) lighting unit).

The light conversion layer may in an embodiment be a multilayer, such as a first layer comprising a luminescent material that is configured to generate red light and a second layer comprising luminescent material that is configured to generate green and/or yellow light. Alternatively or additionally, the light conversion layer may comprise a (protective) coating (see also below), which may in an embodiment also comprise alkali silicate (such as solid water glass), but without luminescent material, and optionally having a different composition.

As indicated above, the light conversion layer may be applied on the die of a LED, but may also be applied on for instance an exit window. Hence, in an embodiment the light conversion layer may be configured remote from the light source, such as on such exit window.

As may be clear from the above, the lighting unit may be configured in different ways. The light conversion may be on the die and/or may be remote, and/or may be dispersed in a (transmissive) dome, may be on the dome; the light conversion layer may used in transmissive way or in a reflective way (although both configurations may be applied in the same lighting unit); the light conversion layer may be coated, etc. Hence, the lighting unit may further comprise a transmissive optical element configured downstream of the light conversion layer, wherein the transmissive optical element may (for instance be) selected from the group consisting of a dome, a coating and a support.

Domes, such as epoxy domes, are well known in the art, and can be used to support light extraction from the LED die. In an embodiment, the dome is the light conversion layer, i.e. the luminescent material is dispersed in the dome. In yet another embodiment, the luminescent material is provided as the light conversion layer, as described herein, on the LED die, and the dome is arranged over the die with light conversion layer. When using a coating on the light conversion layer, the coating may for instance comprise one or more of silicon oxide and silicon nitride. Alternatively or additionally, the coating may comprise a silicone coating, but other (optical) coatings may also be applied.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The alkali silicate may especially comprise $SiO_2 \ast M_2O$ ("water glass"), wherein M comprises a species selected from the group consisting of Li, Na and K, especially at least Na, and wherein the molar ratio between $SiO_2$ and $M_2O$ is in an embodiment in the range of 2:1-4:1 (see also below).

Different types of water glass alkali silicates are characterized by their $SiO_2:M_2O$ ratio, which can especially vary between 2:1-4:1 (i.e. 2-4 mole $SiO_2$ to one mole $M_2O$), especially between 2:1 and 3.75:1. Hence, in an embodiment the molecular weight ratio silicon to alkali metal, as defined by the molar ratio silicon dioxide to alkali oxide, is in the range of 2-4, especially between 2:1 and 3.75, even more especially between 2.5-3.75, even more especially between 2.7-3.5, such as especially between 2.8-3.22. Ratios around (+/−0.2) three seem to provide good coating results (see further also below).

In a specific embodiment, the alkali silicate matrix comprises $M_2SiO_3$, wherein M comprises a species selected from the group consisting of Li, Na and K. In an embodiment, in the same matrix, two or more alkali ions are present, e.g. $(Li,Na)_2SiO_3$. For instance, 70 mole % of M is sodium and 30 mole % of M is lithium. In addition to $M_2SiO_3$, the alkali silicate matrix may also comprise one or more of $M_2O$ and $SiO_2$. Especially, M comprises at least Na (sodium). In a specific embodiment, the alkali silicate matrix comprises $Na_2SiO_3$. $Na_2SiO_3$ is often indicated as sodium water glass. Sodium carbonate and silicon dioxide react when molten to form sodium silicate and carbon dioxide: $Na_2CO_3 + SiO_2 \rightarrow Na_2SiO_3 + CO_2$. Anhydrous sodium silicate contains a chain polymeric anion composed of corner shared {SiO4} tetrahedral. This may also apply to the potassium and lithium variants. The potassium and lithium variants of $(M_2SiO_3)$ water glass are indicated as potassium water glass and lithium water glass, respectively.

The alkali silicate matrix may, in addition to the luminescent material, optionally also comprise other materials, like one or more of a reflective material, an organic material, like glycerol (for instance to improve layer formation), reinforcing fibers (especially glass fibers), etc. When adding other materials, such as reinforcing fibers (like glass fibers), the index of refraction (of such added material) is preferably close to the index of refraction of the alkali silicate matrix or water glass. Especially, the index of refraction of such additive may be within the range of +/−0.20, such as within the range of +/−0.10, especially within the range of +/−0.05 of the index of refraction of the alkali silicate matrix. Further, the alkali silicate matrix may contain (crystal) water. In general, the weight percentage of water is below about 15 wt. %, especially below about 10 wt. %, even more especially less than about 5 wt. %, relative to the total weight of the light conversion layer.

The light conversion layer comprises particulate luminescent material. The particles of the luminescent material are (at least partly) embedded in the alkali silicate matrix. Hence, the latter can be considered a continuous phase. Dependent upon the relative amounts, the alkali silicate may form an integral substantially flat layer, with a smooth, glossy appearance or a layer that may be rough. Especially, the light conversion layer comprises at least 2 wt. % alkali silicate (or water glass), even more especially at least 10 wt. %, yet even more especially at least 20 wt. % alkali silicate, relative to the total weight of the light conversion layer. In an embodiment, the weight ratio of the alkali silicate to the luminescent material in the light conversion layer is in the range of 50:1-1:50, such as 20:1-1:20, especially 10:1-1:10, such as 5:1-1:5, for instance 1:1-1:3. Note that the term luminescent material may also refer to a plurality of different luminescent materials (see also below). The total (i.e. combined) amount of alkali silicate and luminescent material is in general at least 50 wt. %, relative to the total weight of the light conversion layer, even more especially at least 60 wt. %, and even more especially at least 70 wt. %, relative to the total weight of the light conversion layer. Especially, the total amount of alkali silicate and luminescent material may be at least 80 wt. %, especially at least 90 wt. %, such as at least 95 wt. %, relative to the total weight of the light conversion layer.

The luminescent material may in principle be any luminescent material that is suitable to absorb at least part of the light source light and is able to convert at least part of the absorbed light source light into luminescence (especially in the visible). Especially, the luminescent material is configured to absorb at least part of the blue part of the light source light (assuming the light source light to comprise a blue light component).

In an embodiment, the particulate luminescent material comprise one or more luminescent materials selected from the group consisting of a trivalent cerium containing garnet, a divalent europium containing nitride, a trivalent cerium containing oxynitride, and a divalent europium containing oxynitride. Especially those luminescent materials may be excitable in the blue. In this way, if desired, white light may be generated based on blue light source light and one or more of those luminescent materials, optionally in combination with one or more further luminescent materials. Hence, in an embodiment, the light source is configured to generate blue light source light, and the light source and the light conversion layer are configured to provide white lighting unit light. Thus, in an embodiment the light source light is blue and the luminescent material light comprises one or more complementary colors, such as yellow, yellow and red, or green and red, etc.

Examples of (such) (inorganic) luminescent materials include, for example, cerium (Ce) doped Yttrium Aluminum Garnet (YAG), for instance in a molecular ratio of YAG:Ce of 2.1 or 3.3, or cerium doped Lutetium Aluminum Garnet (LuAG) (such as in a similar molecular ratio). Specific examples of suitable inorganic luminescent material are for instance $Y_3Al_5O_{12}:Ce^{3+}$, $Y_2LuAl_5O_{12}:Ce^{3+}$, $YGdTbAl_5O_{12}:Ce^{3+}$, $Y_{2.5}Lu_{0.5}Al_5O_{12}:Ce^{3+}$, $Lu_3Al_5O_{12}:Ce^{3+}$, $(Sr,Ba,Ca)_2SiO_4:Eu^{2+}$, $(Sr,Ca,Ba)Si_2O_2N_2:Eu^{2+}$, $(Ca,Sr,Ba)Ga_2S_4:Eu^{2+}$, $(Ca,Sr,Ba)_2Si_5N_8:Eu^{2+}$, etc. Other blue light excitable luminescnet material may be applied as well.

In a specific embodiment, the luminescent material comprises luminescent quantum dots. Such luminescent material may have the advantage of tunability of the emission band (dependent upon the particle size, as known in the art). Further, such systems may give saturated luminescence colors. Most known quantum dots with emission in the visible range are based on cadmium selenide (CdSe) with a shell such as cadmium sulfide (CdS) and (or) zinc sulfide (ZnS) shell. Cadmium free quantum dots, such as indium phosphide (InP), and/or copper indium sulfide ($CuInS_2$) and/or silver indium sulfide ($AgInS_2$) can also be used. Such luminescent materials may be embedded in a transparent material, such as one or more of the above or below indicated transparent materials.

As indicated above, the term luminescent material may also relate to a plurality of different luminescent materials. Hence, in an embodiment the luminescent material comprises a plurality of luminescent materials. Luminescent materials can be considered different when their spectral distributions of the emission, at the same excitation wavelength, are different.

The particulate luminescent material may for instance comprise luminescent material particles having particle sizes in the range of 0.5-10 µm, especially 50 wt. % or more (of the particles of the particulate luminescent material) have dimensions in the range of 0.5-10 µm, such as at least 85 wt. %. Of course, quantum dots may be smaller.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-540 nm. The terms "yellow light" or "yellow emission" especially relate to light having a wavelength in the range of about 540-570 nm. The terms "orange light" or "orange emission" especially relate to light having a wavelength in the range of about 570-600. The terms "red light" or "red emission" especially relate to light having a wavelength in the range of about 600-750 nm. The terms "visible", "visible light" or "visible emission" refer to light having a wavelength in the range of about 380-750 nm.

In yet a further aspect, the invention provides a process for providing a light conversion layer to a substrate, wherein the light conversion layer comprises an alkali silicate matrix containing luminescent material comprising particles (i.e. particulate luminescent material), the process comprising mixing a particulate luminescent material, an alkali silicate matrix precursor liquid and optionally one or more other components, applying, optionally after one or more further process stages, the thus obtained mixture to a surface of the substrate, and drying the thus formed layer to provide the light conversion layer.

This may be a relative simple process, in general easier than most of state of the art processes to provide light conversion layers, which may lead to the light conversion layers as described above. The substrate may for instance comprise a LED (especially a LED die), a transmissive support (such as intended as exit window) or a wafer (especially comprising a plurality of LED dies). The wafer may be diced afterwards, such as by laser dicing. This is also a specific advantage, as the light conversion layer may be kept substantially unharmed while dicing. Optionally, the support may comprise a cloth of reinforcing fibers, such as based on glass fibers. Alternatively, short-chain fibers may be suspended in the water glass/phosphor suspension prior to coating.

The alkali silicate matrix precursor liquid may for instance be a liquid water glass or a liquidified solid water glass. Water glass powder may be mixed with a liquid, such as water, and the thus obtained liquid (or solution) is combined with the particulate luminescent material, and optional other components. The luminescent material may lead to a suspension of particulate luminescent material in the liquid.

The term "matrix precursor" is used, as the liquid provides the building material which lead to the matrix enclosing (at least partially) the particulate luminescent material after application on the substrate and after drying. In this way, the solid alkali silicate matrix is formed.

Especially, the liquid is water-based. Other components that may be present may for instance be organic low temperature boiling solvents, such as ethanol, acetone, etc., but also other particulate material, such as reflector particles or reinforcement particles such as glass fibers, especially when the ratio is over 1, such as equal to or larger than 2.

The "option one or more further process stages" may include for instance a heating process, a (severe) mixing process, the admixing of one or more further components, etc.

As indicated above, the particulate luminescent material may in an embodiment comprise a plurality of different luminescent materials. This may imply two (or more) types of particles and/or may also imply particles with two (or more) types of luminescent material in the respective particles.

The properties of the light conversion layer may further be influenced by the presence of acidic components in the liquid or in the atmosphere over the light conversion layer when being formed. Hence, in an embodiment, the process further comprises one or more of (i) adding an acidic component to the mixture and (i) guiding an acidic gas or acidic spray over the light conversion thus formed layer. This may improve layer strength and increase resistance against humidity.

The layer may be applied to the surface with methods known in the art, to provide (liquid) coatings. When drying the thus formed layer to provide the light conversion layer, the process may include a heating stage. Especially, drying includes heating the thus formed layer to a temperature that may also be reached when the lighting unit is applied at full power. In an embodiment, the layer (after application to the substrate, such as a LED die or a transmissive support) is heated to a temperature in the range of 200-300° C.

In an embodiment (see also above), the particulate luminescent material comprises luminescent material particles, of which 50 wt. % or more have dimensions in the range of 0.5-10 µm. Further, in an embodiment, the process comprises providing a light conversion layer having a thickness in the range of 5-200 µm, such as 10-100 µm, like 30-70 µm.

As illustrated above, solid water glass may be used as matrix for a particulate luminescent material as a light conversion layer in a lighting unit.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterising features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 1a-1d schematically depict some embodiments of the lighting unit; and

Figure 2A:
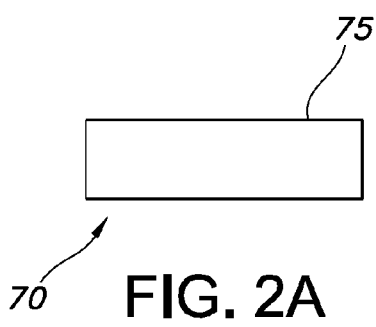
FIGS. 2a-2d schematically depict some further aspects of the invention.

The drawings are not necessarily on scale

DETAILED DESCRIPTION OF THE EMBODIMENTS

FIG. 1a schematically depicts an embodiment of the lighting unit, indicated with reference 100, of the invention. The lighting unit comprises a light source 10, which is in this schematic drawing a LED (light emitting diode). In this embodiment, on top of the light source 10, here on the surface 15, thus downstream of the light source 10, a light conversion layer 20 is provided. This light conversion layer 20 comprises the alkali silicate or water glass matrix 40, with luminescent material particles 55 (see below) within the matrix 40. By way of example, the lighting unit 100 further comprises, for instance for light extraction properties, a (transmissive) dome 61. This is an embodiment of a transmissive optical element 60, which is in this embodiment arranged downstream of the light source 10 and also downstream of the light conversion layer 20. The light source 10 provides light source light 11

(not indicated in this drawing, but see also FIG. 1c), which is at least partly converted by the light conversion layer 20 into luminescent material light 51. The light emanating from the lighting unit is indicated with reference 101, and contains at least this luminescent material light 51, but optionally, dependent upon the absorption of (the luminescent material 50 in) the light conversion layer, also light source light 11.

FIG. 1b schematically depicts another embodiment, without dome, but with an optional coating 62. This coating 62 is a further example of a transmissive optical element 60. Note that the coating 62 may in an embodiment be an alkali silicate layer without luminescent material, but may in another embodiment be a polymeric layer, a silicone layer, or an epoxy layer. Alternatively or additionally, the layer may consist of an inorganic coating, such as a silicone oxide or silicon nitride layer, with especially the function to protect the alkali silicate layer from environmental influences such as water.

In both schematically depicted embodiment of FIGS. 1a-1b, the light conversion layer 20 is in physical contact with the light source 10, or at least its light exit surface, such as the die (light exit surface 15) of a LED. In FIG. 1c, however, the light conversion layer 20 is arranged remote from the light source 10. In this embodiment, the light conversion layer 20 is configured upstream of a transmissive (i.e. light transmissive) support 30 (also considered an example of an optical element 60), such as an exit window. The surface of the support 30, to which the light conversion layer 20 is applied, is indicated with reference 65. Optionally, this surface 65 may be textured. In a specific embodiment, this surface comprises a cloth of reinforcing fibers. Note that the light conversion layer 20 may also be arranged downstream of the support 30, or at both sides of the support light conversion layers 20 may be applied. The distance between the light conversion layer 20 and the light source is indicated with reference d, and may for instance be in the range of 0.1 mm-10 cm. Note that in the configuration of FIG. 1c, in principle also more than one light source 10 may be applied.

FIG. 1d schematically depicts in some more detail the light source 10 and the light conversion layer 20, which comprises the matrix 40, with luminescent material particles 55, which particles comprise the luminescent material 50. The height of the light conversion layer, indicated with d1, may for instance be in the range of 5-200 μm, especially 30-70 μm, such as 40-60 μm. By way of example, this schematic drawing shows that light source light 11 is partly transmitted through the light conversion layer 20, and is partly converted by the luminescent material 50 to provide luminescent material light 51. Together, the luminescent material light 51 and the remaining light source light 11 provide the lighting unit light 101.

Figure 2B:
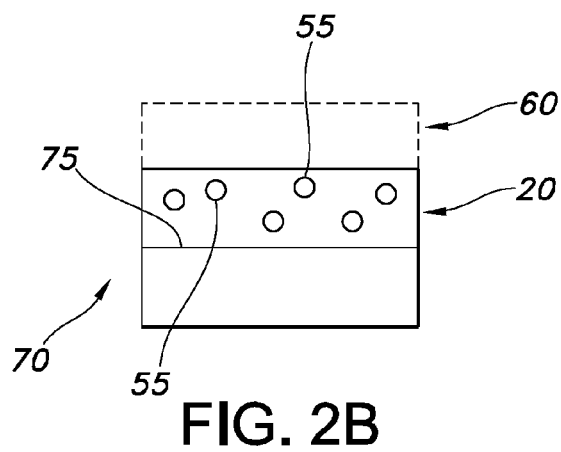
Figure 2C:
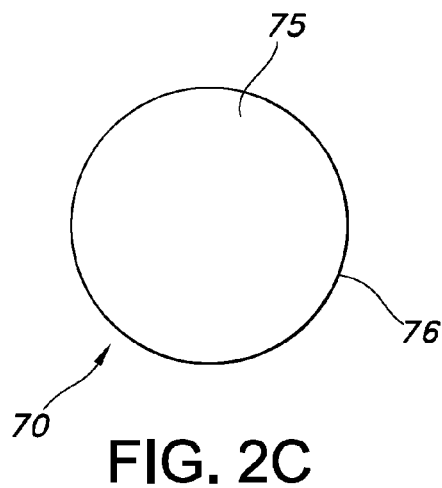

FIG. 2a very schematically depicts a substrate 70, with substrate surface 75, to which the light conversion layer may be applied. This substrate may be the die of the LED, such as schematically depicted in FIGS. 1a-1b, but may also be the transmissive optical element of FIG. 1c. Subsequently, see FIG. 2b, the light conversion layer 20 is applied, by coating the substrate surface 75 with a liquid comprising the alkali silicate matrix precursor liquid and luminescent material particles. In an embodiment, the substrate 70 comprises a wafer 76. After applying the layer (and drying), optionally an optical element 60, like a coating, may be applied.

Figure 2D:
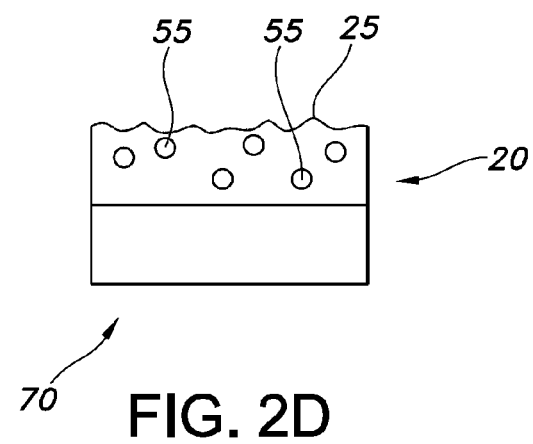

FIG. 2d schematically depicts an embodiment wherein the light conversion layer 20 comprises as surface 25 which is not smooth. For instance, at high weight percentage luminescent material, such rough surface may be obtained. Optionally, a further coating may be applied (see also above).

EXAMPLES AND FURTHER EMBODIMENTS

Water glass as a substitute for silicone as the carrier for luminescent material particles in white-light LEDs was investigated.

Water glass (sodium silicate) is made by fusing varying portions of sand ($SiO_2$) and soda ash ($Na_2CO_3$), where $CO_2$ is driven off. The ratio of these portions determines the properties of the final product. This product is specified as a ratio of $SiO_2/Na_2O$ and as a concentration in water. The sodium may also be replaced by potassium or lithium in order to obtain different properties. After applying water glass as a thin film, water evaporates and leaves a solid coating behind. Lower $SiO_2/Na_2O$ ratios tend to retain water better and hence evaporate slower. For coating applications, higher ratio solutions (approx. 2.8-3.22) are especially recommended. Coatings are most durable (resistant against water and $CO_2$ uptake) if they are completely dehydrated. Complete dehydration may require heat during the drying process. It is recommended to cure the silicate layers at a temperature of 250° C., which is well below the temperature that luminescent materials can stand (nitride-based luminescent materials can stand temperatures up to 350° C. and YAG-based luminescent materials even much higher).

Another method to make the coatings durable is to make use of chemical setting. Silicates can be reacted with a variety of acidic or soluble metal compounds. Neutralizing an alkali silicate with acidic materials polymerizes the silica and forms a gel. Chemical setting agents that can be used in this manner include: mineral and organic acids, $CO_2$ gas, and acid salts such as sodium bicarbonate.

When silicate films are completely dehydrated, they provide excellent resistance to high temperatures. Most silicates have flow points around 850° C. In LEDs such temperatures will never be reached.

Water glass is transparent for visible light and the transmission drops off rapidly below 400 nm, exhibiting a value of approximately 40% at 325 nm. For LEDs that convert blue to white light, this range is sufficient.

Silicate coatings may be brittle. If a higher degree of flexibility is required. Typically 5% by weight of glycerine can be added. Glycerine has a very high transparency for blue light. However, also other materials may be added, such as ethyelene glycol, propylene glycol, an alcohol, etc. Alternatively or additionally, a reinforcing cloth may be applied or reinforcing fibers may be added (see also above).

Coating Procedure

The silicate solution and luminescent material particles are mixed until a uniform dispersion is obtained. The dispersion can then be applied on top of the glass plate that will cover the LEDs (remote application). It can also be applied directly on the surface of LEDs (i.e. on the die), thus avoiding the need for a glass plate. Coating can be done for example by spin coating or spray coating. However, since luminescent material is expensive, a coating method with small losses is preferred. Screen printing or dip coating would lead to small losses. It is also preferred that during the deposition process the quality of the coating is monitored, in order to obtain the desired conversion characteristics.

After the coating has been applied, the substrates are allowed to dry at room temperature. After most of the water has evaporated, the substrates are slowly heated in an oven to 100-300° C., depending on the ratio of $SiO_2$ and $Na_2O$, to dehydrate the coating. Before water the water evaporation step, an after treatment with e.g. $CO_2$ or HCl gas or spray may be applied to obtain chemical setting.

The ratio of silicate and luminescent material may be tuned. A large amount of silicate may lead to luminescent material particles that are completely embedded in silicate and the coating will have a smooth, glossy appearance. In order to obtain a better light out coupling (for the case no dome is used), it may be desired to reduce the silicate content to obtain a rough surface (see also FIG. 2d). Even further reduction of the silicate content would lead to a porous structure. Porous structures have the advantage of an easier evaporation of the water.

Water glass was obtained from Merck as a solution of 10.6% $Na_2O$ and 26.5% $SiO_2$ in water. YAG:$Ce^{3+}$ luminescent material particles were used to make a suspension of luminescent material in water glass, with a 1:1 mass ratio. A 3" Wafer Level Molded Packaging wafer (Silicon Molded Compound, SMC) was half coated by manually dipcoating into the suspension. The other halve was dipcoated into a clear water glass solution. Inbetween the two halves a few LED dies were left uncoated for comparison. The wafer was air dried for a day and then dried in an oven for four hours at 50° C. Inspection showed that the luminescent material-filled coating was porous (open, connected pores). For that reason half of the half wafer was coated again with clear water glass. This clear water glass filled up the pores to leave a dense luminescent material-filled coating. Thus, the wafer contained three different dies: uncoated, coated with dense luminescent material in water glass and coated with porous luminescent material in water glass. The wafer was again dried at room temperature and at 50° C. Subsequently, it was dried at 90° C. for a day, followed by a four-hour 120° C. drying step. Finally, the wafer was dried for four hours at 150° C.

After drying, the wafer was diced with a 2 W, 266 nm UV laser (JPSA) at a dicing speed of 20 mm/s. The water glass layer as well as the SMC layer were laser cut in on step. Water glass material was observed to redeposit next to the kerf. It could easily be removed by scraping with a razor blade without damaging the die.

After removal of the redeposited water glass and after separation of the dies, the thickness of the coating could be measured. The clear water glass was about 30 μm thin and the dense luminescent material loaded water glass about 60 μm.

The surface of the water glass is so hard that it can hardly be scratched. This means that it can serve as a mechanical support/protection during die handling. It could replace the use of laminated glass wafers.

After die separation the samples were soldered onto a substrate in a reflow oven.

Refractive Index

Before measuring the light output of the dies, the refractive index of water glass was measured. A clear water glass coating was prepared by spreading out a drop of water glass on a polyethylene foil. After room temperature drying, the foil was removed and the water glass sheet was further dried in the oven at temperatures of 50°, 90° C. and 120°. Using an Abbe refractometer, the refractive index was measured for different wavelengths. It appeared that the refractive index of water glass closely matches that of the soft dome silicone material. This is a positive result, because it means that the interface between water glass and dome will reflect almost no light back into the die.

Light Output

After soldering the dies to a substrate and molding the silicone dome, the light output was measured. The results showed that the clear water glass does not significantly alter light output with respect to the reference samples. This seems plausible, because of the similar refractive index of dome and water glass. Dies with porous luminescent material produce about 56% of the light of the dies without luminescent material.

In these experiment, color temperatures of about 4200 K were obtained. Of course, other color points may also be obtained, dependent upon the amount and type of luminescent material and wavelength (distribution) of the light source Hence, luminescent material filled water glass has several advantages over luminescent material-filled silicone, such as lower costs, higher thermal conductivity and better resistance against light- and temperature-induced degradation. Water glass can replace silicone and laminated glass wafers in one step. A water glass coating can contain luminescent material particles and is rigid and scratch resistant at the same time. The refractive index of water glass is approximately equal to the index of the silicone dome. Light output of dies with clear water glass is approximately equal to the output of dies without water glass. Dies coated with porous YAG-filled water glass give a good light output. Water glass coatings can be diced with a deep-UV laser.

The invention claimed is:

1. A lighting unit comprising a light source and a light conversion layer, wherein the light source is configured to provide light source light and comprises a light emitting diode (LED), wherein the light conversion layer comprises an alkali silicate matrix containing a particulate luminescent material, wherein the light conversion layer further comprises a reinforcing material, the reinforcing material comprising glass fibers, and wherein the light conversion layer is configured to convert at least part of the light source light into luminescent material light.

2. The lighting unit according to claim 1, wherein the alkali silicate matrix comprises $SiO_2*M_2O$, wherein M comprises a species selected from the group consisting of Li, Na and K, and wherein the molar ratio between $SiO_2$ and $M_2O$ is in the range of 2:1-4:1.

3. The lighting unit according to claim 1, wherein the alkali silicate matrix comprises $M_2SiO_3$, wherein M comprises a species selected from the group consisting of Li, Na and K.

4. The lighting, unit according to claim 2, wherein M comprises Na.

5. The lighting unit according to claim 1, wherein the light source is configured to generate blue light source light and wherein the light source and the light conversion, layer are configured to provide white lighting unit light.

6. The lighting unit according to claim 1, wherein the particulate luminescent material comprise, one or more luminescent materials selected from the group consisting of a trivalent cerium containing garnet, a divalent europium containing nitride, a trivalent cerium containing oxynitride, and a divalent europium containing oxynitride.

7. The lighting unit according to claim 1, wherein the light conversion, layer comprises at least 10 wt. % alkali silicate and wherein the weight ratio of the alkali silicate to the luminescent material in the light conversion layer is in the range of 20:1-1:20.

8. The lighting, unit according to claim 1, further comprising a transmissive optical element configured downstream of the light conversion layer, wherein the transmissive optical element is selected from the group consisting of a dome, a coating and a support.

9. The lighting unit according to claim 1, wherein the light conversion layer is arranged remotely from the light source.

10. A process for disposing a light conversion layer upon a substrate, wherein the light conversion layer comprises an alkali silicate matrix containing luminescent material comprising particles, wherein the light conversion layer further comprises a reinforcing material, the reinforcing material comprising glass fibers, the process comprising obtaining a mixture comprising a particulate luminescent material, an alkali silicate matrix precursor liquid, applying, the mixture to a surface of the substrate, and drying the thus formed layer to provide the light conversion layer.

11. The process according to claim 10, wherein the substrate is selected from the group consisting of a LED, a transmissive support and a wafer.

12. The process according to claim 10, wherein the molecular weight ratio silicon dioxide to alkali, oxide is in the range of 2:1-4:1.

13. The process according to, claim 10, wherein the alkali silicate matrix precursor liquid comprises liquid water glass.

14. The lighting unit according to claim 3, wherein M comprises Na.

15. The lighting unit according to claim 2, wherein the particulate luminescent material comprise, one or more luminescent materials selected from the group consisting of a trivalent cerium containing garnet, a divalent europium containing nitride, a trivalent cerium containing oxynitride, and a divalent europium containing oxynitride.

16. The lighting unit according to claim 3, wherein the particulate luminescent material comprise one or more luminescent materials selected from the group consisting of a trivalent cerium containing garnet, a divalent europium containing nitride, a trivalent cerium containing oxynitride, and a divalent europium containing oxynitride.

17. The lighting unit according to claim 2, wherein the light conversion layer comprises at least 10 wt. % alkali silicate and wherein the weight ratio of the alkali silicate to the luminescent material in the light conversion layer is in the range of 20:1-1:20.

18. The lighting unit according to claim 3, wherein the light conversion layer comprises at least 10 wt. % alkali silicate and wherein the weight ratio of the alkali silicate to the luminescent material in the light conversion layer is in the range of 20:1-1:20.

19. The lighting unit according to claim 4, wherein the particulate luminescent material comprise one or more luminescent materials selected from the group consisting of a trivalent cerium containing garnet, a divalent europium containing nitride, a trivalent cerium containing oxynitride, and a divalent europium containing oxynitride.

* * * * *